United States Patent
Drost et al.

(10) Patent No.: US 6,696,876 B2
(45) Date of Patent: Feb. 24, 2004

(54) CLOCK INTERPOLATION THROUGH CAPACITIVE WEIGHTING

(75) Inventors: Robert J. Drost, Mountain View, CA (US); Robert J. Bosnyak, San Jose, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/759,981

(22) Filed: Jan. 12, 2001

(65) Prior Publication Data

US 2002/0121923 A1 Sep. 5, 2002

(51) Int. Cl.[7] .............................................. H03K 3/00
(52) U.S. Cl. ...................................... 327/298; 327/231
(58) Field of Search ................................ 327/298, 231, 327/233, 235, 337, 538, 543, 537, 390, 427

(56) References Cited

U.S. PATENT DOCUMENTS

| | | | | |
|---|---|---|---|---|
| 4,291,242 A | * | 9/1981 | Schriber | 326/58 |
| 4,689,496 A | * | 8/1987 | Kerber et al. | 327/298 |
| 4,839,787 A | * | 6/1989 | Kojima et al. | 307/110 |
| 5,600,551 A | * | 2/1997 | Luscher, Jr. | 307/110 |
| 5,892,267 A | * | 4/1999 | Takada | 327/536 |
| 5,982,213 A | | 11/1999 | Schenck et al. | 327/276 |
| 6,016,064 A | * | 1/2000 | Saeki | 326/121 |
| 6,121,811 A | * | 9/2000 | Scott et al. | 327/276 |
| 6,157,054 A | * | 12/2000 | Caser et al. | 257/299 |
| 6,201,412 B1 | * | 3/2001 | Iwata et al. | 326/83 |
| 6,466,427 B1 | * | 10/2002 | Chen | 361/306.3 |
| 2002/0041195 A1 | * | 4/2002 | Saeki | 327/113 |

FOREIGN PATENT DOCUMENTS

| | | | |
|---|---|---|---|
| EP | 0738082 A2 | 10/1996 | |
| JP | 62-164309 | * 7/1987 | H03H/19/00 |
| JP | 01258188 | 10/1989 | |

OTHER PUBLICATIONS

Chih –Kong Ken Yang, et al., "A 0.8–μm CMOS 2.5 Gb/s Oversampling Receiver and Transmitter for Serial Links," *IEEE Journal of Solid–State Circuits*, vol. 31, No. 12, pp. 2015–2023, (Dec. 1996).

Stefanos Sidiropoulos, et al., "A Semidigital Dual Delay–Locked Loop," *IEEE Journal of Solid–State Circuits*, vol. 32, No. 11, pp. 1683–1692, (Nov. 1997).

Garlepp B.W. et al., "A Portable Digital DLL for High–Speed CMOS Interface Circuits," *IEEE Journal of Solid–State Circuits*, IEEE Inc., New York, U.S., vol. 34, No. 5, May 1999.

* cited by examiner

*Primary Examiner*—Linh M. Nguyen
(74) *Attorney, Agent, or Firm*—Townsend and Townsend and Crew LLP

(57) ABSTRACT

A clock interpolation circuit for setting and controlling a phase of an output clock that is derived from an interpolation of multiple input clocks. Interpolation is performed by capacitively weighting the multiple clocks. A select and control circuit provides the ability to select different capacitance values to control the weighting. An optional buffer stage is also provided to sharpen the edge transitions of the interpolated clock.

15 Claims, 4 Drawing Sheets

$$P(clk_{out}) = P\left(\frac{Cy}{Cx + Cy}\right)$$

CLOCK INTERPOLATION THROUGH CAPACITIVE WEIGHTING

BACKGROUND OF THE INVENTION

The present invention is directed at phase control of clock signals. More specifically, the present invention is directed at an apparatus for interpolating phase differing clocks through capacitive weighting.

Often it is desirable to be able to precisely control the phase of the clocks used in a circuit. Generating a controlled phase can be difficult. The generation method should work across a broad range of frequencies and would ideally have a control, either analog or digital, which gives monotonic changes and desirably linear changes in the phase position. Monotonicity and linearity are important when the phase position is controlled as part of a servo loop. If the control is not monotonic the servo loop can erroneously "lock-up" in the non-monotonic regions of the phase transfer curve. If the phase control is not linear, then the servo loop will have varying closed loop behavior (poles, zeros, bandwidth, and stability will vary) and it is more difficult to design the servo loop to be stable over all regions of operation.

Past attempts at phase control have contemplated the use of an interpolating buffer to perform phase interpolation. See, for example, Stefanos Sidiropoulos et al., "A Semidigital Dual Delay-Locked Loop, *IEEE Journal of Solid-State Circuits*, vol. 32, no. 11 (1997), pp. 1683–1692 and C. K. Yang et al., "A 0.8-μm CMOS 2.5 Gb/s Oversampling Receiver and Transmitter for Serial Links," *IEEE Journal of Solid-State Circuits*, vol. 31, no. 12 (1996), pp. 2015–2023. Under this past approach, the outputs of two buffers are tied together and the buffers' inputs are configured to accept two clock signals, which are separated by a phase P. The resulting output clock has a phase somewhere between 0 to P. The clock phase can be made selectable from 0 to P by digital control select signals, which control the relative strengths of the two buffers. The disadvantage of this approach is that the buffers present a nonlinear amplification stage, which amplifies even relatively slow clock edges into sharp current steps. In effect, the RC response time of the buffer outputs averages the two sharp current steps into an interpolated voltage waveform. Moreover, if the clock phase separation P is appreciable, compared to the RC response time of the buffer's outputs, then the interpolation is rather poor and the transfer function can become nonlinear.

SUMMARY OF THE INVENTION

This invention is directed at clock interpolation circuit that uses capacitive weighting of out-of-phase clock inputs to control the phase of an interpolated clock output.

In a first aspect of the invention, a clock interpolation circuit comprises a first capacitor having a first terminal configured to accept a first clock having a first phase and a second terminal coupled to an output node providing an interpolated output clock. A second capacitor having a first terminal is configured to accept a second clock having a second phase and a second terminal coupled to the output node. The phase of the output clock is controlled by the ratio of the capacitance of the first capacitor and the capacitance of the second capacitor. The capacitances in this aspect of the embodiment may be fixed or variable.

In a second aspect of the invention, a clock interpolation circuit comprises a first plurality of capacitors coupled to an output node of the circuit and selectively coupled in parallel; a first plurality of switches coupled in series with the first plurality of capacitors, each switch of the first plurality of switches having an open position and a closed position and each switch having a first end coupled to a first clock with a first phase and a second end coupled to a capacitor of the first plurality of capacitors, the first plurality of switches controlled by a plurality of control signals that affect the position of each of the first plurality of switches; a second plurality of capacitors coupled to the output node of the circuit and selectively coupled in parallel; and a second plurality of switches coupled in series with the second plurality of capacitors, each switch of the second plurality of switches having an open position and a closed position and each switch having a first end coupled to a second clock with a second phase and a second end coupled to a capacitor of the second plurality of capacitors, the second plurality of switches controlled by a plurality of control signals that affect the position of each of the second plurality of switches. The output node provides an interpolated output clock having a phase determined by a ratio of a first capacitance of selected capacitors from the first plurality of capacitors and a second capacitance of selected capacitors from the second plurality of capacitors.

In a third aspect of the invention, a clock interpolation circuit comprises a first plurality of capacitors, first means for selecting a first number of capacitors from the first plurality of capacitors so that the first number of capacitors are coupled in parallel and have a first terminal coupled to a first clock having a first phase and a second terminal, a second plurality of capacitors, and second means for selecting a second number of capacitors from the second plurality of capacitors so that the second number of capacitors are coupled in parallel and have a first terminal coupled to a second clock having a first phase and a second terminal coupled to the second terminal of the first number of capacitors. In this aspect of the invention, the interpolation circuit provides an interpolated output clock having a phase determined by a ratio of a capacitance of the first number of capacitors and the second number of capacitors.

In a fourth aspect of the invention, clock interpolation circuit comprises a plurality of capacitors, each capacitor having a first terminal configured to accept a corresponding plurality of clocks of different phases and each capacitor having a second terminal coupled to an output node of the circuit. The output of the clock interpolation circuit provides an interpolated clock having a phase determined by a ratio of the plurality of capacitors.

A further understanding of the nature and advantages of the inventions herein may be realized by reference to the remaining portions of the specification and the attached drawings.

DESCRIPTION OF THE SPECIFIC EMBODIMENTS

Figure 1A:
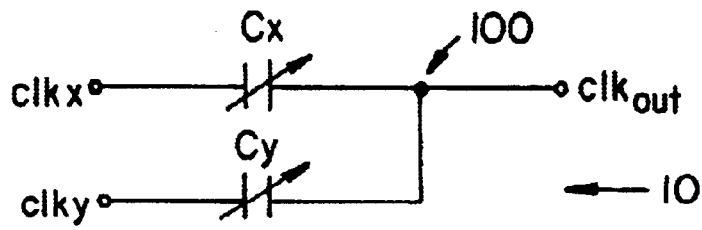
FIG. 1A shows an exemplary clock interpolation, according to an embodiment of the present invention.
Figure 1B:
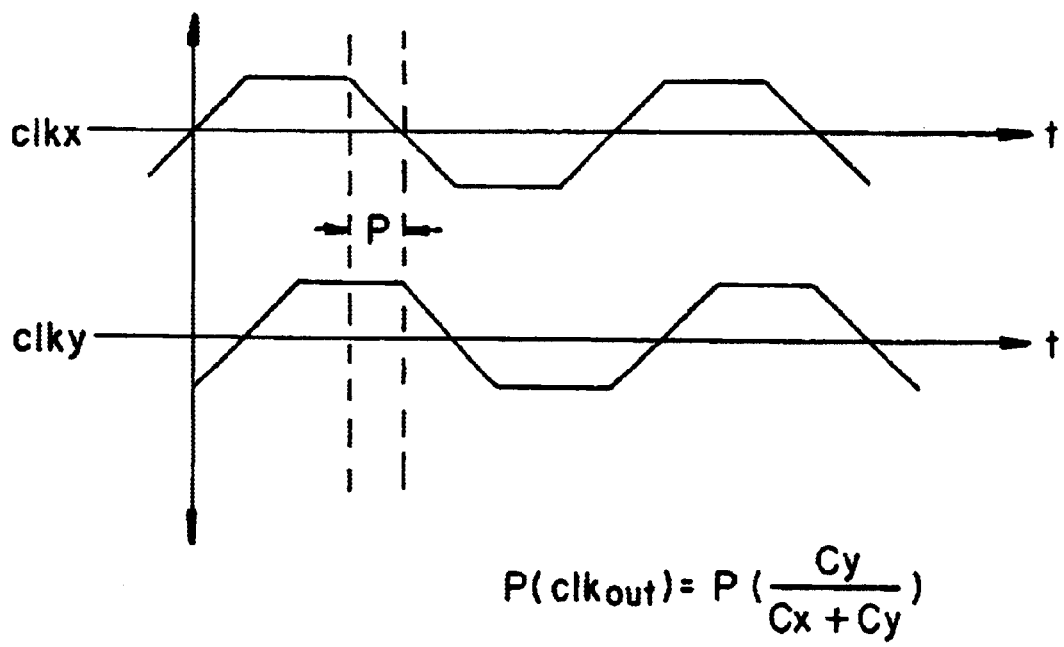
FIG. 1B shows an exemplary timing diagram of a first clock having a first phase and a second clock having a second phase and which may be inputs to the exemplary clock interpolation circuit shown in FIG. 1A.

In a first embodiment of the invention a method and apparatus for performing clock interpolation is disclosed. Referring to FIG. 1A, there is shown a capacitive divider 10, which can be used to perform clock interpolation between two input clock signals clkx and clky. As shown in FIG. 1B, in this exemplary embodiment clky is phase separated from clkx by a phase, P. Clkx is coupled to a first terminal of a first variable capacitor, $C_x$ and clky is coupled to a first terminal of a second variable resistor, $C_y$. Second terminals of both first and second variable capacitors $C_x$ and $C_y$ are coupled to output node 100. The output, clkout, of capacitive divider 10 at node N has an interpolated clock phase equal to $P*C_y/(C_x+C_y)$. Since the capacitors are passive elements, they will not introduce any amplification onto the clock signals before performing the averaging. Thus as long as the two clocks clkx and clky overlap by less than their transition time, the output interpolated clock will not have any plateau and will have a threshold crossing which varies linearly with the capacitive weighting of the two clock signals.

Figure 2:
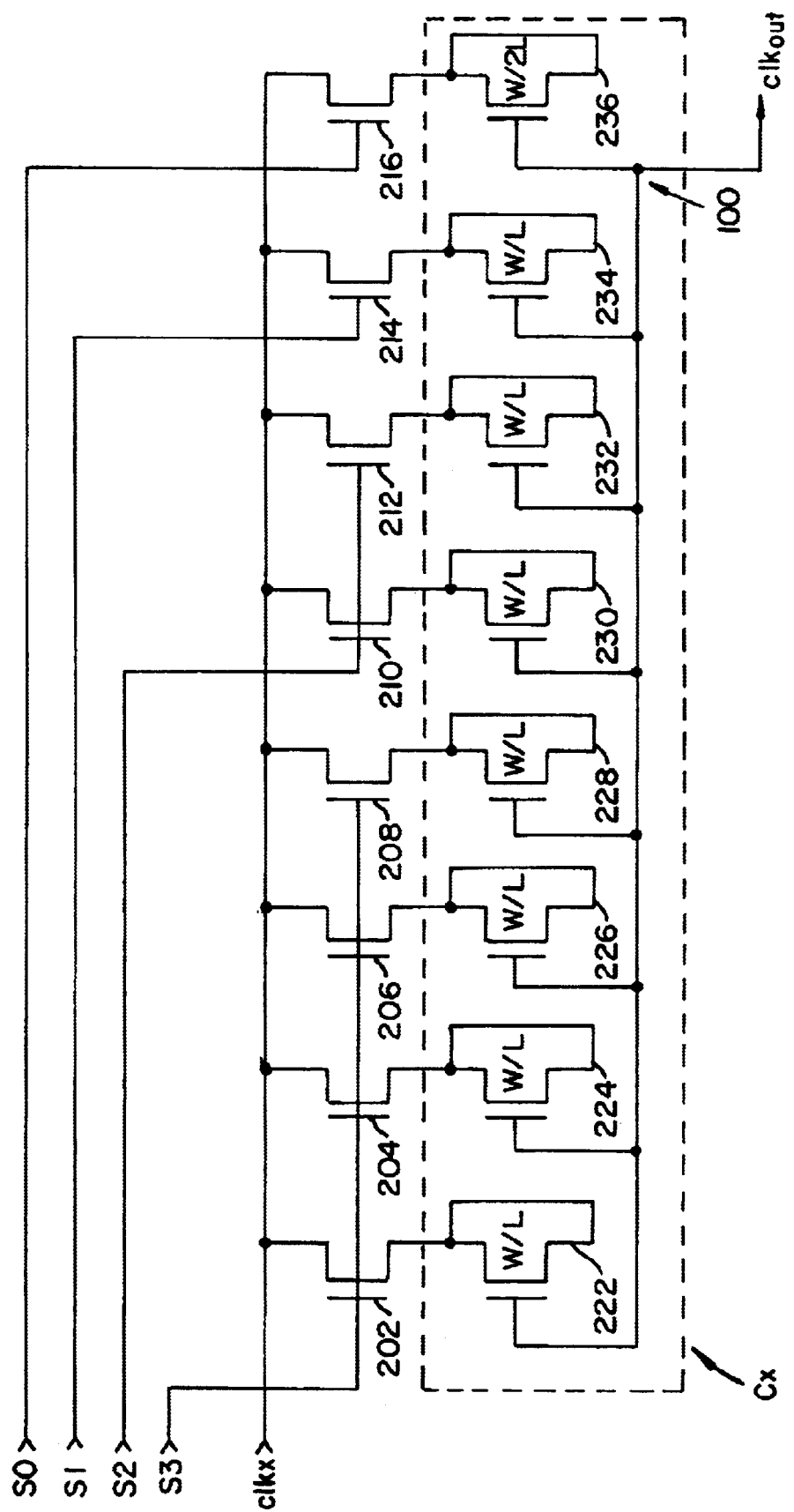
FIG. 2 shows an exemplary select and control a circuit, which can be used to select a given capacitance, according to an embodiment of the present invention.

In order to select different amounts of interpolation, different ratios of capacitance, i.e. $C_x/C_y$, are needed. FIG. 2 shows an exemplary embodiment of a circuit, which can be used to select a given capacitance, according to an embodiment of the present invention. This circuit can be used twice to implement the variable capacitances for each of $C_x$ and $C_y$ in FIG. 1. For ease of illustration, FIG. 2 shows an implementation for the production of variable capacitance, $C_x$. The production of variable capacitance can be produced similarly with the outputs of both $C_x$ and $C_y$ coupled together at node 100 as shown in FIG. 1.

In the exemplary embodiment of FIG. 2, there is shown an input clock, clkx, four digital select signals s1, s2, s3 and s4, and an output, clkout. Clkx is coupled to the drains of each of n-channel metal-oxide-semiconductor field effect transistors (MOSFETs) 202–216. The sources of transistors 202–216 are coupled to the drains of n-channel transistors 222–236, respectively. N-channel transistors 202–216 operate as switches. S3 controls whether transistors 202–208 are on or off, where "on" represents a closed switch condition and "off" represents an open switch condition. If S3 is a logical HIGH, transistors 202–208 are on, i.e. the switches are closed so that clkx is transferred through transistors 202–208 to the drains of transistors 222–228, respectively. Similarly, S2 is coupled to the gates of transistors 210 and 212, S1 is coupled to the gate of transistor 214 and S0 is coupled to the gate of transistor 236 so that if these signals are HIGH, clkx is transferred to the drains of transistors 230–232, 234 and 236, respectively.

Transistors 222–236 are coupled in series with transistors 202–216, respectively, with each of transistors 222–236 functioning as capacitors, since each of these transistors has its drain connected to its source. The capacitance of each is formed between the gate electrode and the drain/source connection.

In the exemplary embodiment shown in FIG. 2, the value of each capacitor formed from transistors 222–236 is proportional to the ratio of the respective transistor's width-to-length. Transistors 222–234 each have a width-to-length ration of W/L and transistor 236 has a width-to-length ratio of ½(W/L). Consequently, the width variations and select signals can be used to obtain various capacitance values.

It should be pointed out that the embodiments shown in both FIGS. 1 and 2 are exemplary, are shown for illustrative purpose, and, therefore, should not be construed as limiting the scope of the invention. First, for example, whereas two clock signals, clkx and clky, are shown in FIG. 1, any number of clock signals can be interpolated through its own variable capacitance coupled to node 100. Second, in reference to FIG. 2, while there is shown a particular number of pass gates (i.e. 202–216) in series with capacitances 222–234, any number of pass gates can be coupled in series with any number of capacitances. Further, these any number of capacitances can be selected as in manner similar to that described above with any number of the pass gates selected in various combinations by any number of select signals.

Moreover, the capacitors used to perform the weighting, together with their associated select transistors, may be constructed in different ways. For example, in an analog process where linear capacitors are readily available they can be implemented using those. On the other hand, in a digital process where linear capacitors are not available they can be implemented instead using, for example, inter-metal capacitances or using a transistor capacitance. Some specific examples of how the capacitors and associated select transistors may be formed are shown in FIGS. 3A–3D.

Figure 3A:
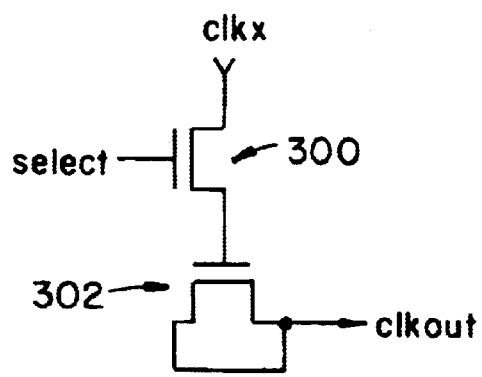
FIGS. 3A–3D show some examples of how a capacitor and associated select transistor may be coupled for use in the exemplary select and control circuit shown in FIG. 2.

In FIG. 3A, an n-channel MOSFET (nmos transistor) 300 has a gate controlled by a select signal, a drain accepting a clock signal, clkx, and a source coupled to the gate of an nmos transistor 302 configured as a capacitor, wherein the source and drain of transistor 302 provide an output for the interpolated clock.

Figure 3B:
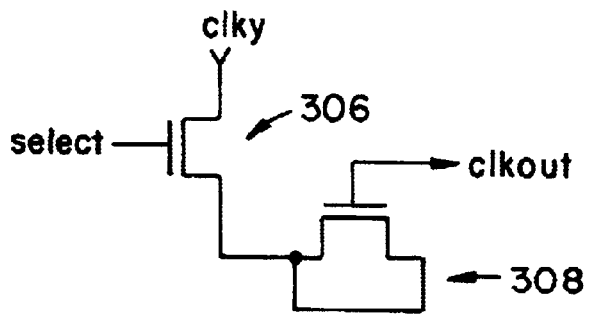

In FIG. 3B, an nmos transistor 306 is configured as in FIG. 3B with the exception that the drain of transistor 306 is coupled to the linked source and drain of nmos transistor 308. The gate of transistor 308 provides the interpolated clock in this example.

Figure 3C:
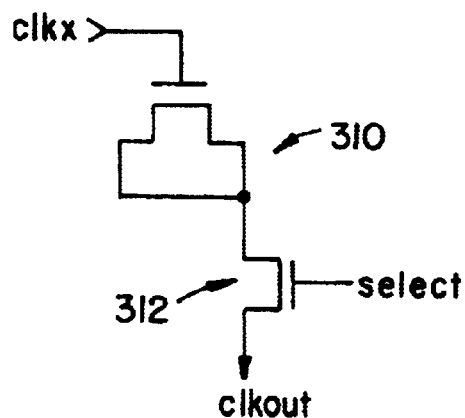

In FIG. 3C, there is shown another implementation. In this embodiment, the series connection of an nmos transistor 310 (configured as a capacitor) and nmos transistor 312 (select transistor) is opposite to the embodiments shown in FIGS. 3A and 3B. The gate of transistor 310 is configured to accept a clock signal, clkx, the drain of transistor 312 is coupled to the linked source and drain of transistor 310, the gate of transistor 312 is controlled by a select signal, and an output for an interpolated clock is provided by the source of transistor 312.

Figure 3D:
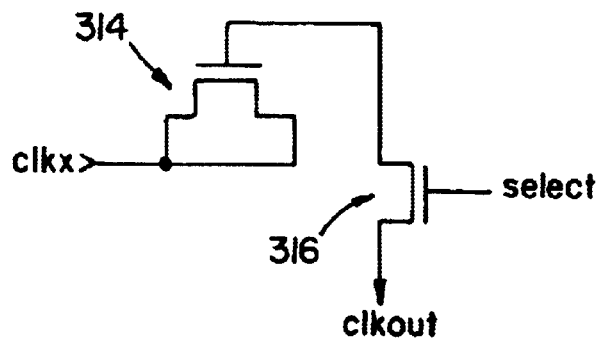

FIG. 3D shows yet another implementation. In this implementation, the linked drain and source of nmos transistor 314 (configured as a capacitor) accepts a clock signal, clkx, the gate of transistor 314 is coupled to the drain of nmos transistor 316 (select transistor), the gate of transistor 316 is controlled by a select signal and an output for an interpolated clock is provided by the source of transistor 316.

The select transistor adds parasitic capacitance due to its source and drain capacitances. The select transistor can be placed between the input clocks and the capacitors. In this case, the parasitic capacitance on the interpolated clock is minimized, while the input clock will see more parasitic capacitance and hence be reduced in amplitude. If the input clocks have sufficient drive capability then this method will give a larger output interpolated clock signal. Otherwise the select transistor can be placed between the capacitor and the interpolated clocks. In that case, the parasitic capacitance on the interpolated clocks will be greater while the input clock will see less parasitic capacitance.

FIGS. 3A–3D show examples of nmos capacitors and nmos select transistors, which may be used in accordance with the present invention. However, pmos transistors can also be utilized. For example, an input clock can be connected to the source/drain of a pmos transistor and the interpolated clock can be supplied by the pmos gate, similar to the nmos arrangement shown in FIG. 3D. If pmos transistors are utilized it is preferred if a common-mode negative voltage difference is applied across the gate and source/drain transistor terminals of the pmos transistor comprising the capacitor in order to ensure that the pmos transistor is held on. Similarly, although not described specifically in reference to the embodiments in FIGS. 3A–3D above, when nmos transistors are used, it is preferred that a common-mode positive voltage be applied across the gate and source/drain terminals of the nmos transistor comprising the capacitor.

In addition to the above, the select transistor can be nmos alone, pmos alone, or both mnos/pmos pairs depending on the voltage range of the input and interpolated clocks.

Figure 4:
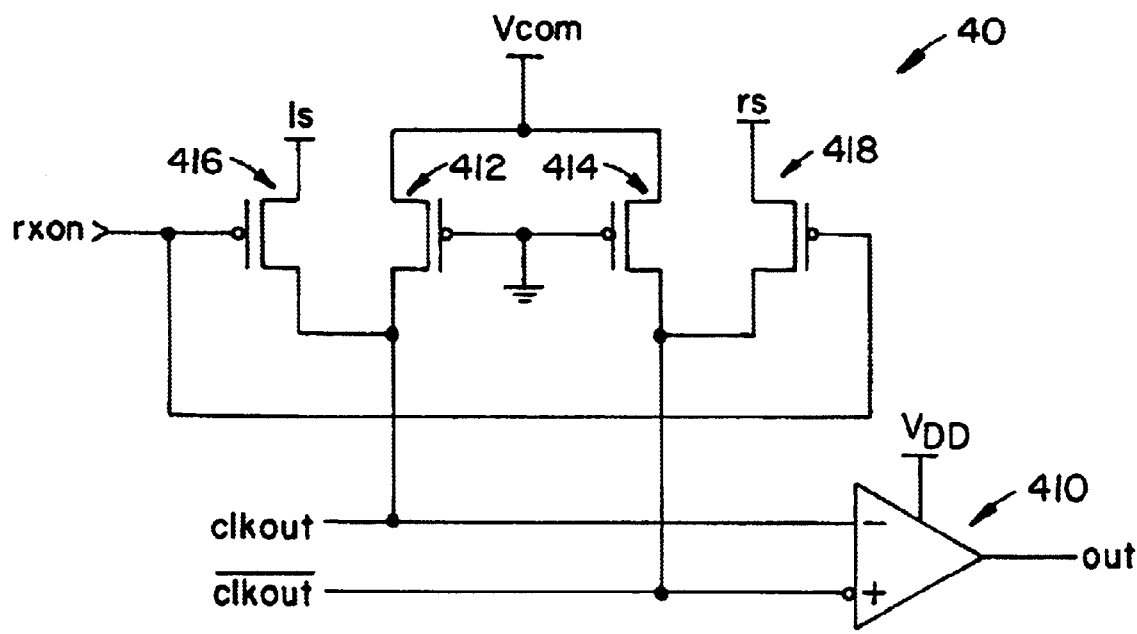
FIG. 4 shows an exemplary buffer circuit that can be employed to sharpen the interpolated clock signal's transitions, according to an embodiment of the present invention.

In another aspect of the invention, a buffer stage can be employed to sharpen the interpolated clock signal's transition, since the transition will often have a shallower slope, relative to the non-interpolated clocks, depending on the interpolation amount. A exemplary circuit 40 for accomplishing this aspect of the invention is shown in FIG. 4. Amplifier 410, functions to sharpen the transition of the interpolated clock, clkout. Pmos transistors 412 and 414 each have their gates connected to ground potential while their drains are coupled to a common voltage, $V_{COM}$. Biasing transistors 412 and 414 in this way ensures that transistors 412 and 414 remain on so that they present themselves as resistive elements. In this manner, common mode voltage is set at the inputs of amplifier 410. The voltage level of $V_{COM}$ determines the common mode voltage around which the interpolated clock, clkout, swings. The signal rxonl, rs and ls control the output of amplifier 410. If rxon is set to $V_{DD}$, pull up transistors 416 and 418 remain off and interpolated clock, clkout, is amplified around the common mode voltage. If rxon and rs are set to ground potential, and ls is set to $V_{DD}$, the non-inverting output (out) of amplifier 410 is pulled to $V_{DD}$. If rxon and Is are set to ground potential, and rs is set to $V_{DD}$, the non-inverting output of amplifier 410 is pulled to ground potential. This provides a convenient mechanism for gating or turning off the clock and may be useful, for example, to conserve power in circuits of the system, which utilize the clock only during times during which the circuits are operating.

Although the invention has been described in terms of a preferred methods and structure, it will be obvious to those skilled in the art that many modifications and alterations may be made to the disclosed embodiments without departing from the invention. Hence, these modifications and alterations are intended to be considered as within the spirit and scope of the invention as defined by the appended claims.

What is claimed is:

1. A clock interpolation circuit, comprising:
   a first plurality of capacitors coupled to an output node of the circuit and selectively coupled in parallel;
   a first plurality of switches coupled in series with the first plurality of capacitors, each switch of the first plurality of switches having an open position and a closed position and each switch having a first end coupled to a first clock with a first phase and a second end coupled to a capacitor of the first plurality of capacitors, the first plurality of switches controlled by a plurality of control signals that affect the position of each of the first plurality of switches;
   a second plurality of capacitors coupled to the output node of the circuit and selectively coupled in parallel;
   a second plurality of switches coupled in series with the second plurality of capacitors, each switch of the second plurality of switches having an open position and a closed position and each switch having a first end coupled to a second clock with a second phase and a second end coupled to a capacitor of the second plurality of capacitors, the second plurality of switches controlled by a plurality of control signals that affect the position of each of the second plurality of switches,
   wherein the output node provides an interpolated output clock having a phase determined by a ratio of a first capacitance of selected capacitors from the first plurality of capacitors and a second capacitance of selected capacitors from the second plurality of capacitors,
   an amplifier configured to accept the interpolated clock; and
   a circuit configured to set a common mode voltage at differential inputs of the amplifier.

2. The clock interpolation circuit of claim 1, wherein one or more of the first plurality of capacitors are formed from an n-channel MOSFET.

3. The clock interpolation circuit of claim 1, wherein one or more of the first plurality of capacitors are formed from a p-channel MOSFET.

4. The clock interpolation circuit of claim 1, wherein one or more of the first plurality of capacitors is formed from an inter-metal capacitance of a multi-metal layer integrated circuit.

5. The clock interpolation circuit of claim 1, wherein one or more of the second plurality of capacitors is formed from an inter-metal capacitance of a multi-metal layer integrated circuit.

6. The clock interpolation circuit of claim 1, wherein one or more of the first plurality of switches comprise a MOS- FET having a gate configured to accept one of the control signals, a drain coupled to the first clock and a source selectively coupled to the corresponding serially connected capacitor of the first plurality of capacitors, depending on a voltage level of the one of the control signals.

7. A clock interpolation circuit, comprising:
 a plurality of capacitors, each capacitor having a first terminal configured to accept a corresponding plurality of clocks of different phases and each capacitor having a second terminal coupled to an output node of the circuit; and
 an output node providing an interpolated clock having a phase defined by a function dependent upon the phases of the plurality of clocks and the capacitances of the capacitors, wherein the function is equal to $$\frac{\sum_{n=1}^{m} P_n C_n}{\sum_{n=1}^{m} C_n}$$

where $P_n$, is the phase of the nth clock of the plurality of clocks, $C_n$ is the capacitance of the nth capacitor and m is an integer greater than or equal to two.

8. The clock interpolation circuit of claim 7, wherein one or more of the capacitances are variable.

9. The clock interpolation circuit of claim 7, further comprising a buffer.

10. The clock interpolation circuit of claim 9, wherein the buffer comprises:
 an amplifier having a plurality of input terminals; and
 a common control circuit coupled to the input terminals of the amplifier.

11. The clock interpolation circuit of claim 10, wherein the common control circuit comprises a plurality of resistive elements coupling the amplifier input terminals to a common voltage source.

12. The clock interpolation circuit of claim 11, wherein the common control circuit further comprises a plurality of switches turning off an output of the amplifier, thereby turning off the clock.

13. The clock interpolation circuit of claim 7, wherein one or more of the plurality of capacitors is a variable capacitor comprising a plurality of programmably coupled capacitors.

14. The clock interpolation circuit of claim 13, wherein one or more of said plurality of programmably coupled capacitors are formed from an n-channel MOSFET.

15. The clock interpolation circuit of claim 13, wherein one or more of said plurality of programmably coupled capacitors are formed from a p-channel MOSFET.

* * * * *